United States Patent

Corisis et al.

[11] Patent Number: 6,031,733
[45] Date of Patent: Feb. 29, 2000

[54] PREVENTING MOVEMENT OF INTEGRATED CIRCUIT PACKAGES RELATIVE TO THEIR SUPPORT SURFACE

[75] Inventors: David J. Corisis; Walter L. Moden, both of Meridian; Terry R. Lee, Boise, all of Id.

[73] Assignee: Micron Technology, Inc., Boise, Id.

[21] Appl. No.: 09/152,376

[22] Filed: Sep. 14, 1998

Related U.S. Application Data

[62] Division of application No. 08/978,397, Nov. 25, 1997, Pat. No. 5,944,199.
[51] Int. Cl.⁷ .................. H02B 1/01; H05K 7/14
[52] U.S. Cl. .................. 361/825; 783/801; 211/41.17
[58] Field of Search .................. 361/728, 752, 361/753, 756, 759, 796, 797, 801, 802, 825; 211/41.7, 41.17, 41.8, 26, 26.2; 257/685, 686, 707

[56] References Cited

U.S. PATENT DOCUMENTS

| | | | |
|---|---|---|---|
| 3,098,177 | 7/1963 | Bleier et al. | 361/802 |
| 5,394,305 | 2/1995 | Moral et al. | 361/776 |
| 5,594,627 | 1/1997 | Le | 361/801 |
| 5,822,193 | 10/1998 | Summers et al. | 361/759 |

*Primary Examiner*—Leo P. Picard
*Assistant Examiner*—Jayprakash N. Ghandhi
*Attorney, Agent, or Firm*—Trop, Pruner, Hu & Miles, P.C.

[57] ABSTRACT

A system for supporting integrated circuit packages to prevent mechanical failure of the packages at their connection to a printed circuit board or card involves bracing the packages to the board or card. The packages may also be braced against one another. The structure is particularly well adapted to supporting vertical surface mount packages at a point spaced from the point where they connect to a printed circuit board or card.

22 Claims, 2 Drawing Sheets

PREVENTING MOVEMENT OF INTEGRATED CIRCUIT PACKAGES RELATIVE TO THEIR SUPPORT SURFACE

This is a divisional of prior application Ser. No. 08/978, 397 filed Nov. 25, 1997 now U.S. Pat. No. 5,944,199.

BACKGROUND OF THE INVENTION

This invention relates generally to packages with a tall aspect ratio, such as vertical surface mount packages ("VSMP"), for integrated circuits and particularly, to techniques for supporting those structures.

In a variety of computer applications it is desired to reduce bus lengths to enable higher operating frequencies. For example, a number of memory and other devices may be connected to a bus in a computer system. The more space the devices take, generally the longer the bus length. The longer bus length normally adds resistance and capacitance which may be adverse to achieving higher bus operating frequencies. By mounting the devices on edge, the devices may be packed more closely, reducing bus lengths and making possible higher bus operating frequencies.

Because VSMP technology involves positioning the packages in an on-edge vertical alignment, the devices have considerable moment arms about their points of connection to the printed circuit board ("PCB") or card. The VSMP is generally supported on a pair of L-shaped leads and may have no other connection to the PCB or card.

Although the VSMP package improves signal integrity at high frequencies by minimizing the bus length, the VSMP packages may be prone to a variety of stress and vibration induced failures because of their on-edge orientation. Thus, it would be desirable to have a way to provide tall aspect ratio packages which are more resistant to mechanical failures.

SUMMARY OF THE INVENTION

In accordance with one aspect of the present invention, a support for an integrated circuit package extending upwardly from a surface includes a first portion arranged to engage the package at a point spaced above the location where the package is connected to the surface. A second portion, connected to the first portion, is adapted to prevent movement of the package relative to the surface.

In accordance with another aspect of the present invention, an integrated circuit device, electrically connectable to a surface, includes an electrical connection from the surface to the device. A first portion is arranged to engage the device at a point spaced above the connection. A second portion is connected to the first portion and is adapted to prevent movement of the device relative to the surface.

In accordance with still another aspect of the present invention, an electronic device includes a plurality of integrated circuit packages. A surface is electrically connected to each of the plurality of packages. A support is arranged to engage each of the packages at a point spaced above the surface to prevent movement of the packages relative to the surface.

In accordance with yet another aspect of the present invention, a method for preventing relative movement between a surface and an integrated circuit package connected to the surface includes the step of engaging the package at a point spaced away from the location where the package is connected to the surface. The package is braced to the surface to prevent movement of the package relative to the surface at the point of engagement of the package.

In accordance with yet another aspect of the present invention, a device for preventing relative movement between a plurality of vertical surface mount packages and a surface includes a first portion arranged to engage a pair of packages at a point spaced away from the location of the connection between the packages and the surface. A second portion is connected to the first portion and to the surface.

In accordance with but another aspect of the present invention, a method for stabilizing vertical surface mount packages mounted on a surface includes the step of inserting a member between two adjacent packages. The packages are braced against movement relative to the surface.

In accordance with another aspect of the present invention, a computer system includes a printed circuit board and an integrated circuit connected to and extending away from the board. A device is arranged to engage the integrated circuit at a point spaced from the connection to the board to prevent relative movement between the board and the integrated circuit.

In accordance with but another aspect of the present invention, a method for preventing relative movement between a surface and an integrated circuit package connected to the surface includes the step of engaging the package at a point spaced away from the location where the package is connected to the surface. The integrated package is braced to the surface to prevent movement of the package relative to the surface at the point of engagement of the package.

In accordance with another aspect of the present invention, a method for stabilizing a vertical surface mount package secured to a surface includes the step of sliding an engaging framework over the package. The framework is secured to a structure other than the package.

In accordance with still another aspect of the present invention, a method for stabilizing integrated circuit packages secured to a surface involves arranging a support about the package. The support is expanded into engagement with the package.

In accordance with another aspect of the present invention, a support for an integrated package is connectable to a surface. A member is adapted to be positioned about said package. The member is expandable in response to heat into engagement with the package. A connection is made between the member and the surface.

The details of one or more embodiments of the inventions are set forth in the accompanying drawing and the description below. Other features, objects, and advantages of the invention will be apparent from the description and drawings, and from the claims.

DESCRIPTION OF THE PREFERRED EMBODIMENTS

Figure 1:
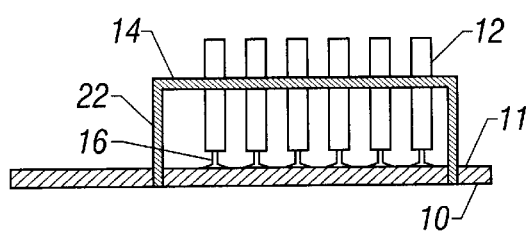
FIG. 1 is a cross-sectional view taken generally along the line 1—1 in FIG. 2.

Referring to the drawing wherein like reference characters are utilized for like parts throughout the several views, a PCB or card 10 includes an upper surface 11 which secures a plurality of the VSMPs 12 or other packages on the surface 11 by way of a support 14. Each package 12 extends vertically from a pair of opposed, L-shaped contacts 16. While the present invention is described with respect to an illustrated embodiment involving VSMPs, the present invention may be applied for any package having a substantial height or a tall aspect ratio.

Figure 2:
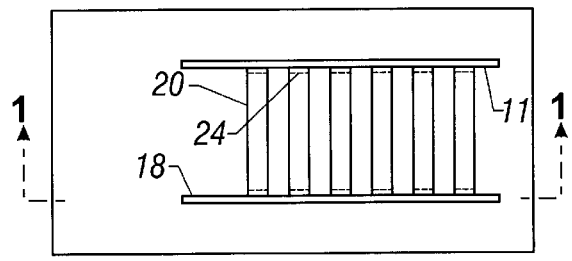
FIG. 2 is a top plan view of the embodiment shown in FIG. 1.

The support 14 includes a pair of parallel rails 18, shown in FIG. 2, which engage the opposed side edges 20 of each package 12. Each rail 18 includes a post 22, shown in FIG. 1, which may pluggingly engage the PCB or card 10. For example, each of the packages 12 may include a notched portion 24 which is engaged by a bump or tab 26 connected to each of the rails 18.

In this way, each of the packages 12 is supported from below on the contacts 16 and also at a point spaced above the point of connection to the PCB or card 10 by the rails 18 which in turn are connected to the posts 22. This stabilizes the vertically mounted packages 12 against vibration and excessive bending forces around their point of connection to the PCB or card 10.

Figure 3:
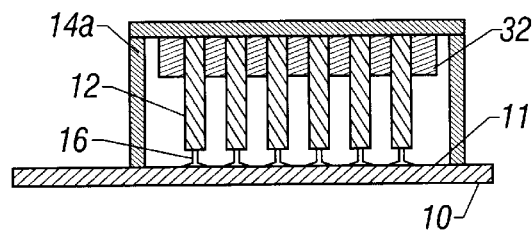
FIG. 3 is a vertical cross-sectional view through a second embodiment of the present invention.
Figure 4:
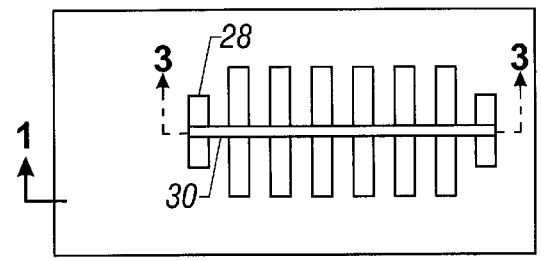
FIG. 4 is a top plan view of the embodiment shown in FIG. 3.

Referring to FIGS. 3 and 4, a support 14a includes a pair of spaced lugs 28 (shown in FIG. 4) and a transverse cross piece 30 which engages the top edges of the packages 12. The support lugs 28 provide a wide base for connection to the cross piece 30 to stabilize the connection between the cross piece 30 and the tops of the packages 12. The lugs 28 may plug into the board 10.

The undersurface 31 of the cross piece 30 has a combed configuration with a plurality of teeth 32 which extend downwardly and engage each package 12 snugly on two sides. The entire support 14a may be molded of plastic material. Alternatively, the teeth 32 could be formed of foam material attached to a plastic molded cross piece 30.

Again, the connection between the package 12 and teeth 32 results in diminished relative vibration forces on the packages 12 and stabilization against bending forces acting about the contacts 16. Thus, if the packages 12 are securely retained at a point spaced from their points of connection 16 to the PCB or card 10, mechanical failures should be reduced.

Figure 5:
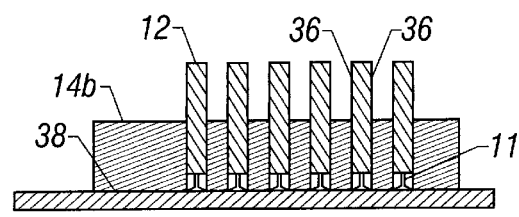
FIG. 5 is a vertical cross-sectional view through another embodiment of the present invention.
Figure 6:
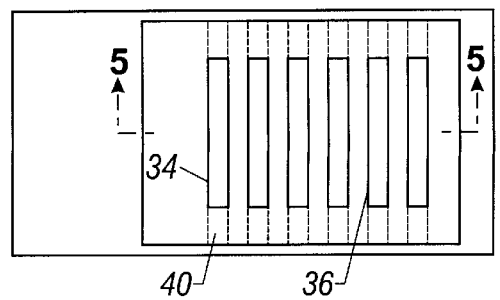
FIG. 6 is a top plan view of the embodiment shown in FIG. 5.

Turning now to FIGS. 5 and 6, a support 14b may be entirely or partly formed of a plastic foam material. Advantageously, the foam is an antistatic foam such as a high density polystyrene foam. As shown in FIG. 6, the foam may be in the form of a block having a plurality of slits 34 formed therein. Each slit 34 preferably has a cross-sectional size corresponding to that of the packages 12. As a result, when the support 14b is slid over and down on the packages 12, they telescope through the foam support 14b. Thus, the packages 12 are snugly engaged by the resiliency of the foam against their sides 36. The height of the foam support 14b is subject to considerable variation but, as illustrated, the foam may extend a substantial portion of the height of the packages 12. In this way, the packages 12 are stabilized at a point spaced from their point of connection 16 to the PCB card 10.

Advantageously the lower surface 38 of the foam is covered with an adhesive material to adhesively secure the foam support 14b to the upper surface 11 of the board or card 10. In addition, if desired, transversely extending slots 40 may be formed in the support 14b which allow air circulation from the exterior to the underside section of each package 12 and particularly to the opening 42 under each package.

Figure 7:
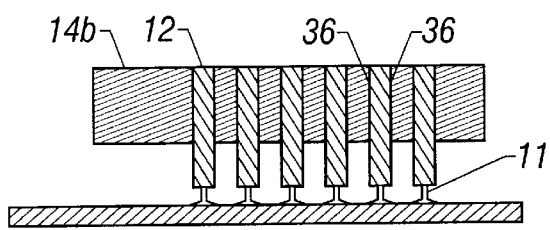
FIG. 7 is a top plan view of another embodiment of the present invention.

In addition, the support 14c may be made in whole or in part of a heat expandable material. Suitable expandable plastics include thermoplastic elastomers including ethylene-propylene copolymers, polyethylene, ethylene copolymers, ionomers, polyvinyl chloride polymers, and styrene butadiene block polymers. These polymers may be combined with a blowing or foaming agent so that when the support 14c is subjected to a predetermined temperature it expands volumetrically. In this way, the support 14c can be positioned about a package 12, as shown in FIG. 7, with the slots 34 having a larger cross-sectional area than the packages 12. The support 14 volumetrically expands to resiliently engage package 12, as illustrated in FIG. 6.

It is also advantageous if the foam or other conformal material is heat conductive to spread the heat and reduce package temperature. The foam or other conformal material could be antistatic foam or a material with heat conductiving fibers or particles such as metal fibers dispersed through the material.

Figure 8:
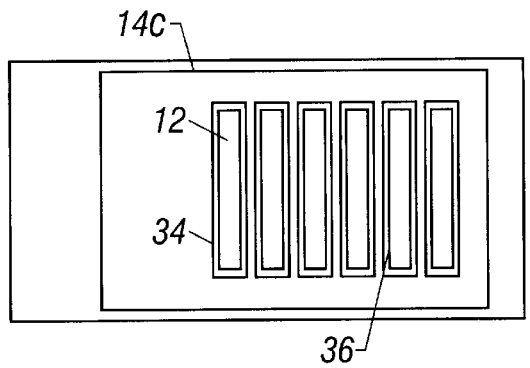
FIG. 8 is a vertical cross-sectional view through another embodiment of the present invention.

The support 14 may also be spaced from the board 10, as shown in FIG. 8. While a foam or conformal support 14b is shown in FIG. 8, other rigid supports, such as the support 14a without the vertical portions, shown in FIG. 3, may be used. By blocking the devices 12 against one another in this fashion, the stresses on the devices 12 may be reduced.

Figure 9:
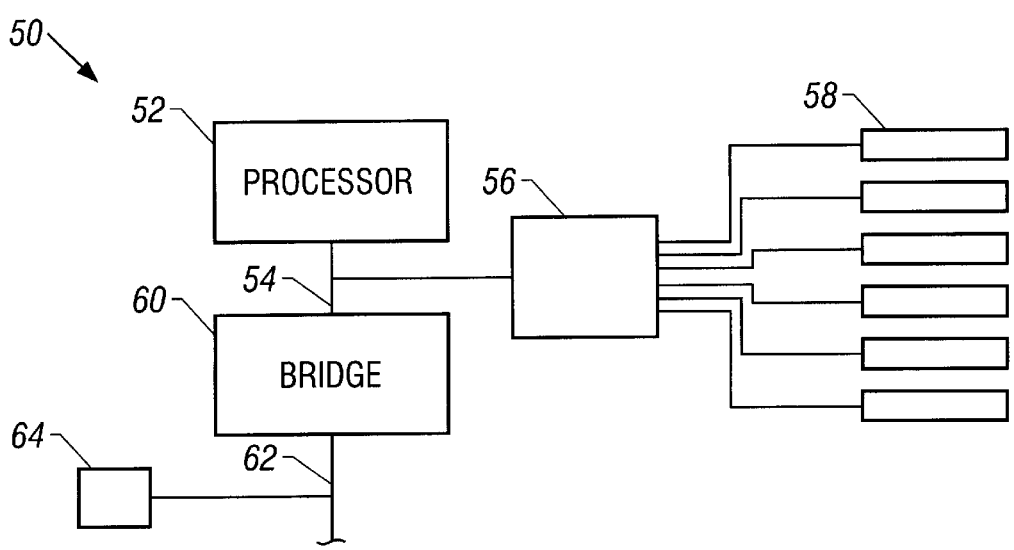
FIG. 9 is a schematic depiction of a computer system in accordance with one aspect of the present invention.

Referring to FIG. 9, an exemplary computer system 50 in accordance with the present invention is illustrated. As illustrated, the system 50 includes a microprocessor 52 and a system bus 54. The system bus 54 connects to a memory controller 56 which in turn connects to a plurality of memory devices 58 which may be implemented as packages 12. The microprocessor 52 also connects to a bridge 60 which in turn connects to at least one additional bus, such as a peripheral component interconnect or PCI bus 62. A plurality of input-output devices 64, such as a keyboard, monitor, hard disk drive, modem or the like may be connected to the bus 62.

While the present invention has been described with respect to a limited number of embodiments, those skilled in the art will appreciate numerous modifications and variations and it is intended that all variations and modifications as fall within the true spirit and scope of the present invention should be covered by the appended claims.

What is claimed is:

1. A support including an integrated circuit package electrically connected to a surface through an electrical connection, said support comprising:

a first portion arranged to engage said package at a point spaced above said electrical connection to said surface; and a second portion connected directly to said first portion and said surface, said second portion adapted to prevent movement of said package relative to said surface.

2. The support of claim 1, wherein said first portion engages said package on its upper end.

3. The support of claim 1, wherein said first portion includes pair of surfaces to engage said package on two opposed surfaces of said package.

4. The support of claim 3, wherein said first and second portions are made at least in part of conformal material.

5. The support of claim 3, wherein said first portion is adapted to be resiliently biased against the sides of said package.

6. The support of claim 3, wherein said first portion is adapted to contact the side edges of said package.

7. The support of claim 1, wherein said second portion is directly connected to said surface.

8. The support of claim 3, wherein said first and second portions are made at least in part of plastic foam.

9. The support of claim 8, wherein said portions are made of resilient plastic foam with at least one slot formed therein.

10. The support of claim 9, wherein said foam includes adhesive on its bottom to secure said foam to said surface.

11. A method for preventing relative movement between a surface and an integrated circuit package connected to said surface, comprising:

engaging said package at a point spaced away from the location where said package is connected to said surface; and bracing said package to said surface to prevent movement of said package relative to the surface at the point of engagement of said package.

12. The method of claim 11, including the step of engaging a plurality of packages, said packages having opposed side surfaces and an upper edge, side edges, and a bottom edge, said bottom edge connected to said surface, said method including the step of engaging the side surfaces of said packages.

13. The method of claim 12, including the step of resiliently engaging said packages.

14. The method of claim 11, including the step of engaging the top edges of said packages.

15. The method of claim 11, including the step of simultaneously engaging a plurality of adjacently positioned packages and bracing said packages against said surface and against each other.

16. The method of claim 11, including the step of telescopically sliding a foam portion over said package into engagement with said surface.

17. A method for stabilizing integrated circuit packages secured to a surface, comprising:

sliding an engaging framework over said packages;

resiliently engaging said packages; and securing said framework to a structure other than said packages.

18. The method of claim 17, including the step of also securing said framework to said packages.

19. The method of claim 17, including the step of clamping said packages to said surface.

20. A method for stabilizing integrated circuit packages secured to a surface, comprising:

arranging a support about a package; and causing said support to expand into engagement with said package.

21. The method of claim 20, including heat expanding said support.

22. The method of claim 20, including securing said support to said surface.

* * * * *